United States Patent [19]

Mullgrav, Jr.

[11] Patent Number: 5,191,301
[45] Date of Patent: Mar. 2, 1993

[54] INTEGRATED DIFFERENTIAL VOLTAGE CONTROLLED RING OSCILLATOR

[75] Inventor: Allan L. Mullgrav, Jr., Wappingers Falls, N.Y.

[73] Assignee: International Business Machines Corporation, Armonk, N.Y.

[21] Appl. No.: 881,960

[22] Filed: May 12, 1992

[51] Int. Cl.$^5$ ............................................. H03B 5/02
[52] U.S. Cl. ........................................ 331/57; 331/75; 331/108 B; 331/177 R
[58] Field of Search ........... 331/57, 75, 108 B, 108 C, 331/108 D, 111, 177 R

[56] References Cited

U.S. PATENT DOCUMENTS

| | | | |
|---|---|---|---|
| 4,519,086 | 5/1985 | Hull et al. | 375/120 |
| 4,565,976 | 1/1986 | Campbell | 331/57 |
| 4,641,048 | 2/1987 | Pollock | 307/591 |
| 4,694,261 | 9/1987 | Ewen et al. | 331/57 |
| 4,695,808 | 9/1987 | Cabaniss et al. | 331/57 |
| 4,797,586 | 1/1989 | Traa | 307/603 |
| 4,833,425 | 5/1989 | Culican, Sr. et al. | 331/1 A |
| 4,833,695 | 5/1989 | Greub | 331/57 X |
| 4,862,020 | 8/1989 | Cowan et al. | 307/601 |
| 4,876,519 | 10/1989 | Davis et al. | 331/57 |
| 4,879,530 | 11/1989 | Wilhelm et al. | 331/45 |
| 4,884,041 | 11/1989 | Walker | 331/57 |
| 4,978,927 | 12/1990 | Hausman et al. | 331/57 |
| 4,994,763 | 2/1991 | Chen et al. | 331/57 |
| 5,012,142 | 4/1991 | Sonntag | 307/602 |

OTHER PUBLICATIONS

IBM Technical Disclosure Bulletin, "High-Frequency Voltage-Controlled Oscillator", vol. 33 No. 5 Oct. 1990, pp. 260-262.
IBM Technical Disclosure Bulletin, "Improved Clamp for Differential VCO and Single-Shot", vol. 30 No. 8, Jan. 1988 pp. 237-238.

*Primary Examiner*—Siegfried H. Grimm
*Attorney, Agent, or Firm*—Whitham & Marhoefer

[57] ABSTRACT

A highly stable, high frequency voltage controlled oscillator (VCO) for phase locked loops is adapted to be fully integrated on a single silicon chip and is operable over a wide frequency range without using off-chip capacitors. The VCO is a fully differential ring oscillator with fully differential voltage control. The VCO is constructed from basic blocks made of differential emitter coupled transistor pairs. Voltage control is provided by differential d.c. amplifiers which vary the capacitive load seen by the logic blocks.

6 Claims, 4 Drawing Sheets

INTEGRATED DIFFERENTIAL VOLTAGE CONTROLLED RING OSCILLATOR

BACKGROUND OF THE INVENTION

1. Field of the Invention

The present invention generally relates to electronic voltage controlled oscillator (VCO) circuits having particular application in phase locked loop circuits and, more particularly, to a fully differential, fully symmetrical VCO circuit with low susceptibility to power supply and current source noise.

2. Description of the Prior Art

Phase locked loops are used in many diverse applications, including optical serial data links, multiple clock frequency generation, and FM demodulation just to name a few. An important component of a phase locked loop is the voltage controlled oscillator (VCO). It is desirable to integrate all of the components of the VCO onto a single silicon chip for cost minimization as well as noise considerations.

U.S. Pat. No. 4,833,425 to Culican et al. provides just such an integrated VCO. However, when operating in the range of hundreds of MHz and beyond, it is extremely important to minimize the effects of noise on the power supplies and at inputs, so a differential approach is needed. M. N. Shen et al., in "High-Frequency Voltage-Controlled Oscillator", *IBM Technical Disclosure Bulletin*, vol. 33, no. 5, October 1990, pp. 260-262, describes a monolithic high frequency voltage controlled oscillator consisting of a temperature and voltage-compensated control voltage generator and a ring type voltage-controlled oscillator. The ring type voltage-controlled oscillator is composed of N stages of differential amplifiers with the outputs of the Nth stage being crosscoupled with the inputs of the first stage. Oscillation frequency is determined by the number of stages N and the bias current of the individual differential amplifiers. While the Shen et al. circuit uses differential amplifiers, the control voltage is single-ended.

SUMMARY OF THE INVENTION

It is therefore an object of the present invention to provide a highly stable, high frequency VCO for phase locked loops, which VCO is adapted to be fully integrated on a single silicon chip and is operable over a wide frequency range without using off-chip capacitors.

According to the invention, there is provided a fully differential ring oscillator VCO with fully differential voltage control. This has been accomplished by constructing a ring oscillator from basic blocks made of differential emitter coupled transistor pairs. Voltage control is provided by differential d.c. amplifiers which vary the capacitive load seen by the logic blocks.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
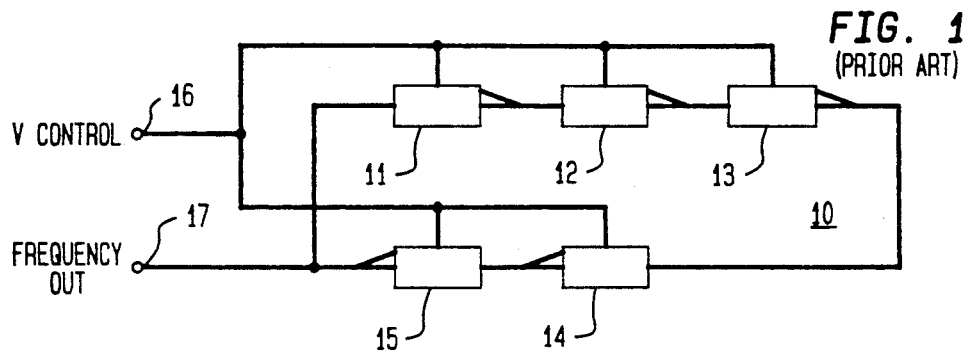
FIG. 1 is a simplified schematic diagram illustrating an example of a ring oscillator known in the prior art.

Referring now to the drawings, and more particularly to FIG. 1, there is shown a ring oscillator 10 of the type shown in the above referenced patent to Culican et al. The ring is made of inverting logic blocks 11 to 15 connected in cascade. Since there are an odd number of inverting logic blocks, logic "1s" are generated by alternate ones of the logic blocks and propagate around the ring. Were there an even number of inverting logic blocks, a static condition of alternating "1s" and "0s" would exist, and there would be no oscillation. The control voltage is applied at terminal 16 which is connected in common to the power supply inputs of each of the inverting logic blocks 11 to 15. The center frequency of the ring oscillator 10 is determined by the delay of each logic block 11 to 15 and the number of logic blocks in the ring, so no off-chip components are required. Frequency control is achieved by varying the supply voltage to the logic blocks in the ring. Thus, the rate at which the logic "1s" propagate around the ring is determined by the control voltage applied at terminal 16. The output of logic block 15, in addition to being connected to the input of logic block 11, is connected to output terminal 17 from which the output frequency signal of the ring oscillator is taken.

The inverting logic blocks 11 to 15 have some immunity to noise except during the transition periods of each cycle. While the transition period at lower frequencies is not significant, at higher frequencies, the transition period becomes a large percentage of the total cycle, and the single-ended nature of the logic block connection makes it susceptible to noise. The voltage control applied to terminal 16 is also single-ended, so any noise at that input would affect the output frequency.

Figure 2:
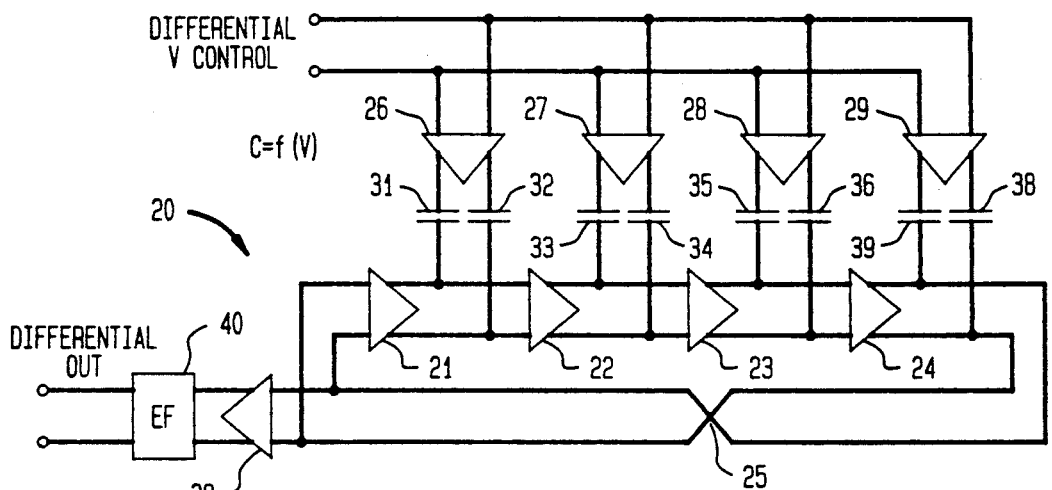
FIG. 2 is a simplified schematic diagram illustrating the principles of operation of the differential ring oscillator according to the present invention.

A representation of the improved VCO according to this invention is shown in FIG. 2, to which reference is now made. It consists of a series of differential inverter logic blocks 21 to 24 connected in a ring 20. A twist 25 between the outputs of the last block 24 and the inputs of the first block 21 causes the ring 20 to oscillate. As in the circuit shown in FIG. 1, the frequency of oscillation is determined by the number of blocks in the ring, so that no off-chip components are required. Voltage control of the frequency is achieved by the d.c. differential amplifiers 26 to 29 which are connected by capacitors 31 to 38 to some or all of the logic block outputs. The capacitors are integrated in the oscillator chip and manufactured such that their capacitance varies with the amount of voltage applied across them. Changing the differential input voltage of the d.c. amplifiers 26 to 29 changes the loading effect that the capacitors 31 to 38 have on the logic blocks 21 to 24, thereby changing the frequency. An additional logic block 39 and emitter follower circuit 40 provide a buffer for the output signal.

Figure 3:
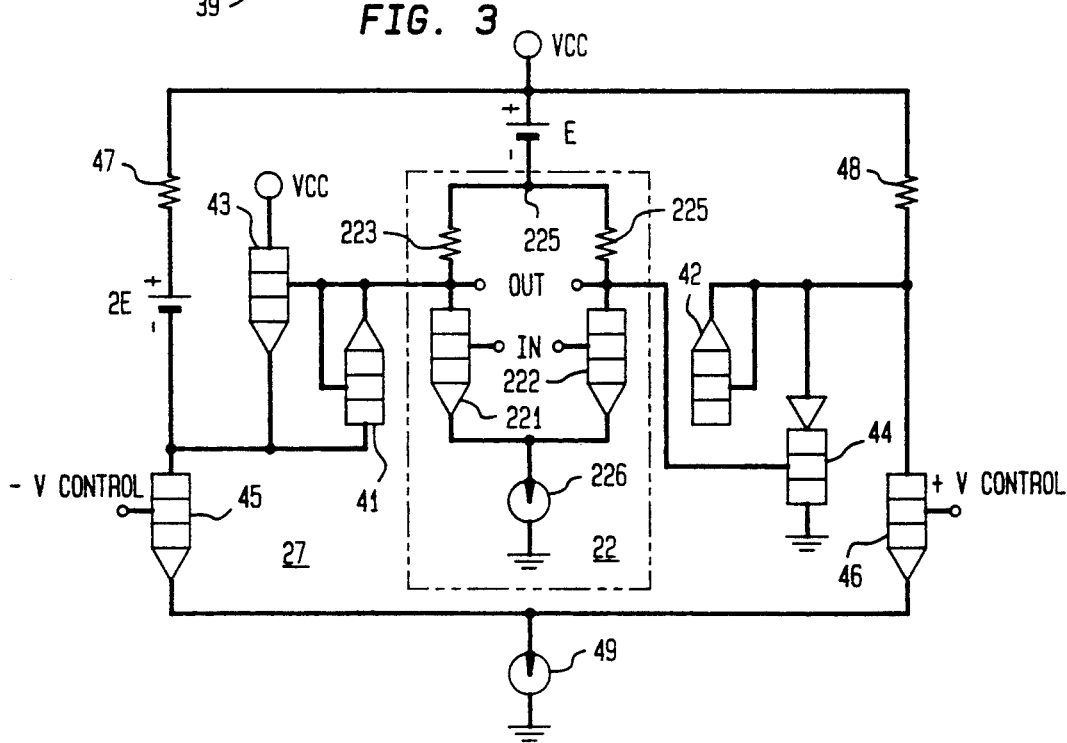
FIG. 3 is a detailed schematic diagram showing a simplified circuit of a single d.c. differential amplifier connected to an emitter coupled logic block.

FIG. 3 shows a simplified schematic of a single d.c. differential amplifier 27 connected to an emitter coupled logic block 22. Several such circuits are connected together to form the ring oscillator 20, as indicated in FIG. 2. The logic block 22 comprises differentially connected NPN transistors 221 and 222 having respective equal valued load resistors 223 and 224 connected to a common junction 225. The emitters of transistors 221 and 222 are connected in common to a current sink 226.

The voltage-sensitive capacitors 31 and 32 shown in FIG. 2 are implemented by using forward biased NPN transistor base-collector junctions 41 and 42, as shown in FIG. 3. Each of these junctions is forward biased, on the average, by the amount E, when there is no differential input control voltage applied. Changing the value of E in the design moves the center frequency point to the left or to the right on the frequency versus voltage characteristic curve shown in FIG. 7. Clamp transistors 43 and 44 prevent the forward biased junctions 41 and 42, respectively, from conducting enough current to affect the voltage swing of the logic block 22. The input control voltage is applied to differentially connected NPN transistors 45 and 46 having respective load resistors 47 and 48. The load resistors 47 and 48 are equal in resistance value to load resistors 223 and 224. A further bias of 2E is connected in series with the load resistor 47 of transistor 45. The emitters of transistors 45 and 46 are connected in common to a current sink 49.

It can be seen from the symmetrical nature of the circuit that it is more immune to external noise than the prior art. Since the input control voltage is differential, any noise there would be rejected by the common-mode rejection ratio. Power supply ground or current sink noise will tend to affect both sides of each base-collector junction capacitor equally, effectively canceling itself out.

Figure 4:
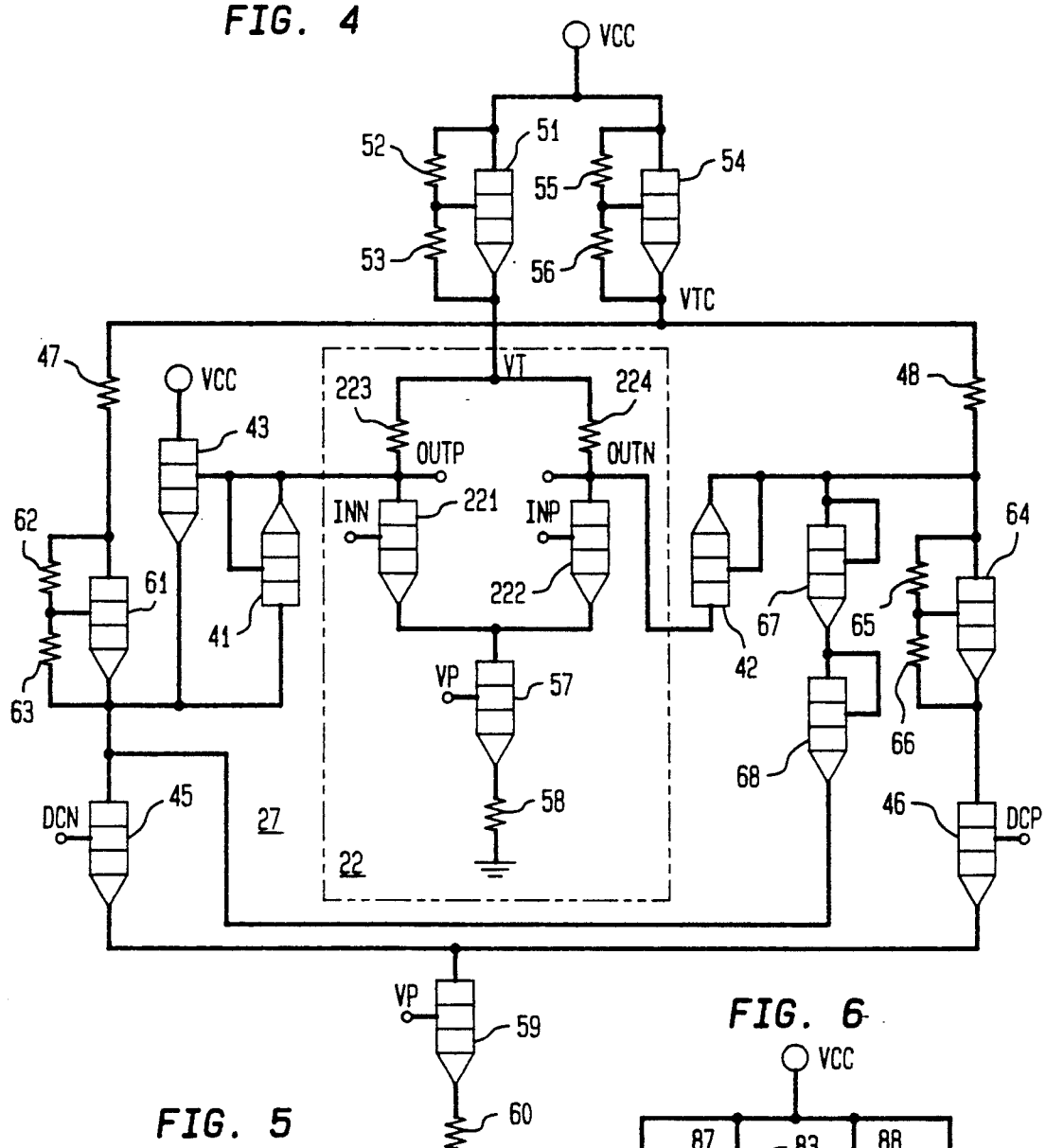
FIG. 4 is a detailed schematic diagram showing a single logic block and d.c. differential control voltage amplifier according to a preferred embodiment of the invention.

A preferred embodiment of a single logic block 22 and d.c. differential control voltage amplifier 27 of the invention is shown in FIG. 4. A first voltage source, consisting of NPN transistor 51 and resistors 52 and 53 connected between node VCC and node VT, and a second voltage source, consisting of NPN transistor 54 and resistors 55 and 56 connected between node VCC and node VTC, maintain node VT at a voltage E below node VTC. The current sinks 226 and 49 are implemented by identical NPN transistor 57 and resistor 58 and NPN transistor 59 and resistor 60, respectively. Each of transistors 57 and 59 is biased by a voltage VP. Since the current sinks are identical, and since load resistors 223, 224, 47 and 48 have identically the same resistance values, then base-collector junction 42 is forward biased by the amount E. The magnitude of a third voltage source, consisting of NPN transistor 61 and resistors 62 and 63 connected between the load resistor 47 and the collector of transistor 45, is 2×E so that base-collector junction 41 is also forward biased by the amount E. A fourth voltage source, consisting of NPN transitor 64 and resistors 65 and 66 connected between load resistor 48 and the collector of transistor 46, maintains symmetry in the collector loading of transistors 45 and 46. Clamp transistor 44 of FIG. 3 is replaced by diodes 67 and 68 because of the unavailability of a PNP transistor in the technology used.

Nodes INP and INN are the positive and negative input terminals of the emitter coupled logic block 22. They are connected to the output terminals of the previous logic block in the ring. Nodes OUTP and OUTN are the positive and negative output terminals of the logic block 22. They are connected to the input terminals of the next logic block in the ring. Nodes DCP and DCN are the positive and negative input terminals of the d.c. differential amplifier that provides voltage control of the ring oscillator frequency.

Figure 5:
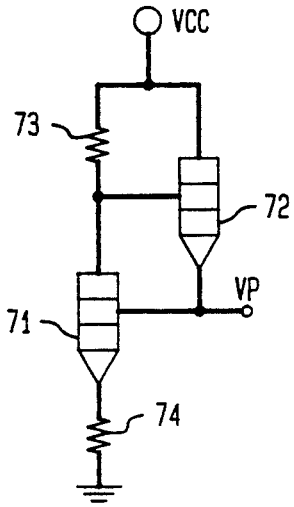
FIG. 5 is a schematic diagram showing an example of a reference circuit that may be used at reference node VP in the circuit shown in FIG. 4.

A reference voltage for the current sinks comprising transistors 57 and 58 is required at node VP. An example of a reference circuit that may be used at node VP is shown in FIG. 5. This circuit comprises two NPN transistors 71 and 72 and two resistors 73 and 74. Resistor 73, transistor 71 and resistor 74 are connected in series between node VCC and ground. Transistor 72 has its collector connected to the node VCC, its base connected to the collector of transistor 71, and its emitter connected to the base of transistor 71. The junction of the emitter of transistor 72 and the base of transistor 71 is connected to the node VP.

Figure 6:
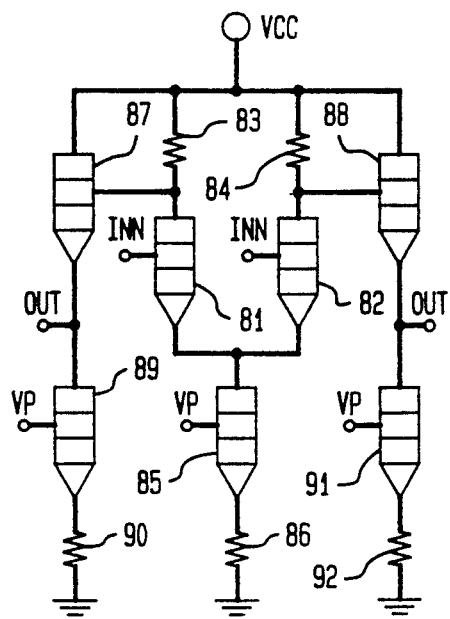
FIG. 6 is a schematic diagram showing an example of an output emitter follower circuit which may be used with the circuit shown in FIG. 4.

An emitter follower output logic block, corresponding to 40 shown in FIG. 2, is shown in FIG. 6 for completeness. This circuit comprises a pair of differentially connected NPN transistors 81 and 82 having respective load resistors 83 and 84 connected to the node VCC. The emitters of transistors 81 and 82 are connected in common to a current sink comprising NPN transistor 85 and resistor 86. The input terminals INP and INN are connected to the positive and negative outputs of the logic block 39 shown in FIG. 2. The differential emitter follower outputs are provided by NPN transistors 87 and 88 respectively connected to the collectors of transistors 81 and 82. The loads for the emitter follower transistors 87 and 88 are provided by identical current sinks respectively composed of NPN transistor 89 and resistor 90 and NPN transistor 91 and resistor 92.

In FIG. 4, a small positive differential voltage applied between input nodes DCP and DCN causes the average voltages across 41 and 42 to be reduced, thereby reducing their capacitances. This reduction of loading on the logic blocks in the ring oscillator causes the frequency to increase. Similarly, a small negative differential voltage causes the frequency to decrease. However, common mode voltage change has virtually no effect on the frequency of the ring oscillator.

Figure 7:
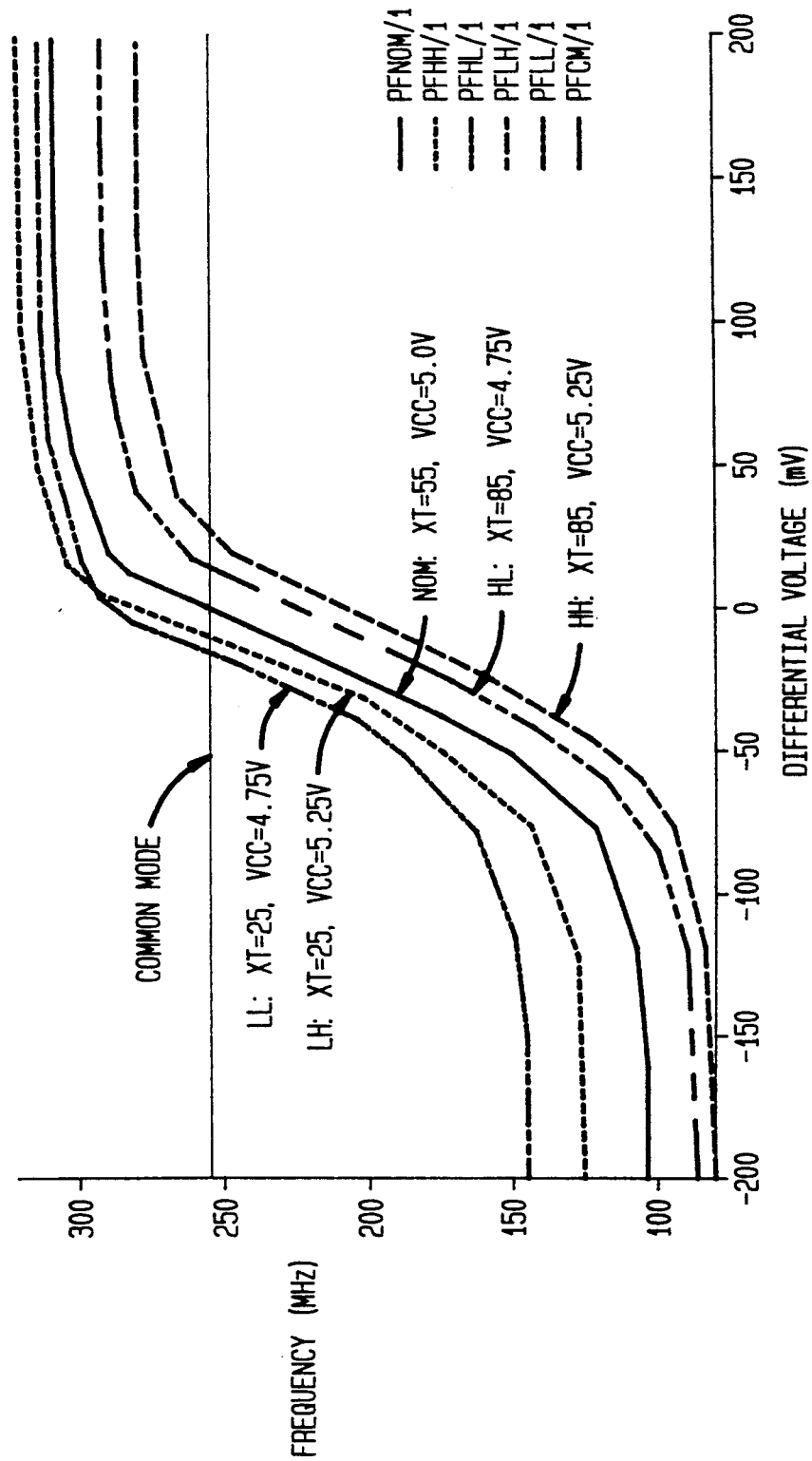
FIG. 7 is a graph showing the VCO frequency as a function of the differential voltage for the circuit shown in FIG. 4.

Computer simulation of the ring oscillator using a ten-block ring, with each logic block controlled by a d.c. differential amplifier, yielded the frequency versus differential voltage characteristic curves shown in FIG. 7. The nominal center frequency is 256 MHz. The nominal differential gain is 2.4 GHz/V, while the common mode gain is less than 360 KHz/V. The curves in FIG. 7 show the frequency characteristics at various temperature and power supply conditions. The curves can be moved vertically by changing the number of logic blocks in the ring and can be moved horizontally by adjusting the design value of E biasing the base-collector junctions. The value of E used in the simulation is 0.4 V. In FIG. 7, the curves are labeled HH for high temperature, high power supply, HL for high temperature, low power supply, LH for low temperature, high power supply, and LL for low temperature, low power supply. No attempt was made to compensate the circuit for temperature or power supply variations, but well known standard techniques may be applied as desired. Similarly, the gain may be varied as desired by standard differential amplifier design techniques.

The power used by the simulated ring oscillator is as follows:

| | |
|---|---|
| 10 logic blocks @ 1 mW/block = | 10 mW |
| 10 d.c. control blocks @ 1 mW/block = | 10 mW |
| 1 output logic block = | 1 mW |
| 1 VP reference supply = | 1 mW |
| 1 emitter follower differential output = | 14 mW |
| Total = | 36 mW |

Figure 8:
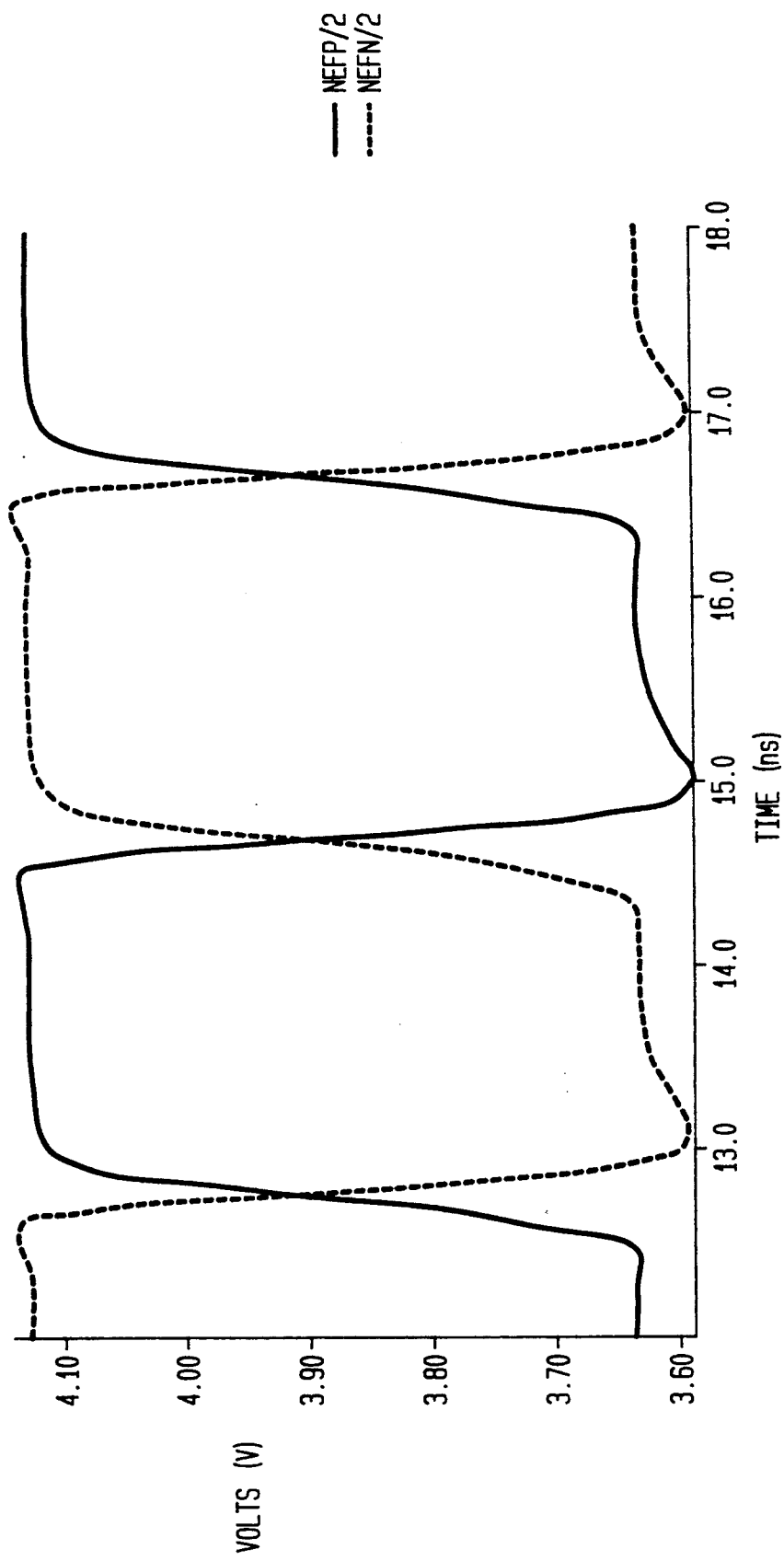
FIG. 8 is a graph showing the VCO emitter follower output as a function of time.

The differential output voltage waveforms of the emitter follower are shown in FIG. 8. The nominal duty cycle is 50.47%.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A voltage controlled oscillator integrated on a single semiconductor chip comprising:
   a plurality of differential inverter logic blocks connected in a ring;
   a source of differential control voltage;
   a plurality of d.c. differential amplifiers each connected to said source of differential control voltage;
   a plurality of pairs of capacitors connecting differential outputs of said d.c. differential amplifiers to at least some of said differential inverter logic blocks, a change in said source of differential control voltage changing a loading effect that said capacitors have on corresponding differential inverter logic blocks and changing the frequency of the ring oscillator; and
   output means connected to an output of one of said differential inverter logic blocks and providing a differential output having a center frequency determined by said differential inverter logic blocks connected in said ring.

2. The voltage controlled oscillator recited in claim 1 wherein said plurality of d.c. differential amplifiers is equal in number to said plurality of differential inverter logic blocks, each of said d.c. differential amplifiers being connected to a corresponding one of said differential inverter logic blocks by a corresponding pair of capacitors.

3. The voltage controlled oscillator recited in claim 2 wherein the number of said differential inverter logic blocks is an even number and a differential connection between a first and a last differential inverter logic block in said ring is crossed to produce a twist in said connection.

4. The voltage controlled oscillator recited in claim 3 wherein said output means comprises a further inverter logic block connected in series with a differential emitter follower.

5. A voltage controlled oscillator integrated on a single semiconductor chip comprising:
   a plurality of differential inverter logic blocks connected in a ring;
   a source of differential control voltage;
   a plurality of d.c. differential amplifiers each connected to said source of differential control voltage;
   a plurality of pairs of forward biased PN junctions connecting differential outputs of said d.c. differential amplifiers to at least some of said differential inverter logic blocks, said PN junctions functioning as variable capacitors in response to a change in said source of differential control voltage to change a loading on corresponding differential inverter logic blocks and changing the frequency of the ring oscillator as a function of said control voltage; and
   output means connected to an output of one of said differential inverter logic blocks and providing a differential output having a center frequency determined by said differential inverter logic blocks connected in said ring.

6. The voltage controlled oscillator recited in claim 5 wherein said output means comprises a further inverter logic block connected in series with a differential emitter follower.

* * * * *